US007462530B2

(12) United States Patent
Rittaku

(10) Patent No.: US 7,462,530 B2
(45) Date of Patent: Dec. 9, 2008

(54) METHOD FOR MANUFACTURING A SEMICONDUCTOR DEVICE HAVING AN ELEMENT ISOLATION REGION

(75) Inventor: Satoshi Rittaku, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/011,774

(22) Filed: Dec. 11, 2001

(65) Prior Publication Data

US 2003/0001210 A1   Jan. 2, 2003

(30) Foreign Application Priority Data

Jun. 28, 2001   (JP) ............... 2001-197190

(51) Int. Cl.
*H01L 21/8238*   (2006.01)
(52) U.S. Cl. ............... 438/208; 438/203; 257/370; 257/E21.676
(58) Field of Classification Search ............... 257/273, 257/350, 368–370, 337–338, 552, 554, 556, 257/378–381, 371, 372, 373, 376, 544, 545, 257/549, E21.696; 438/202, 208, 220, 258, 438/416, 203, 207
See application file for complete search history.

(56) References Cited

U.S. PATENT DOCUMENTS

| 4,637,125 A | * | 1/1987 | Iwasaki et al. | ............... 438/203 |
|---|---|---|---|---|
| 4,646,124 A | * | 2/1987 | Zunino | ............... 257/370 |
| 4,887,142 A | * | 12/1989 | Bertotti et al. | ............... 257/338 |
| 5,376,816 A | * | 12/1994 | Nishigoori et al. | ............... 257/370 |
| 5,426,328 A | * | 6/1995 | Yilmaz et al. | ............... 257/552 |
| 5,648,281 A | * | 7/1997 | Williams et al. | ............... 437/33 |
| 5,899,714 A | * | 5/1999 | Farrenkopf et al. | ............... 438/202 |

FOREIGN PATENT DOCUMENTS

| JP | 59-55052 | | 3/1984 |
|---|---|---|---|
| JP | 5-67735 | | 3/1993 |
| JP | 406029470 A | * | 2/1994 |

* cited by examiner

*Primary Examiner*—Douglas M. Menz
*Assistant Examiner*—Steven J. Fulk
(74) *Attorney, Agent, or Firm*—McDermott Will & Emery LLP

(57) ABSTRACT

An n-type buried diffusion layer is formed on the surface layer of the prescribed area of a p-type silicon substrate, and a p-type first high-concentration isolation diffusion layer is formed in the silicon substrate so as to surround the buried diffusion layer. An n-type epitaxial layer is formed on the silicon substrate, the buried diffusion layer, and the first high-concentration isolation diffusion layer. A p-type second high-concentration isolation diffusion layer is formed in the epitaxial layer on the first high-concentration isolation diffusion layer. A p-type low-concentration isolation diffusion layer for isolating the epitaxial layer into a plurality of island regions is formed in the epitaxial layer on the second high-concentration isolation diffusion layer.

5 Claims, 16 Drawing Sheets

Fig. 23 *Background Art*

Fig. 25 — Background Art
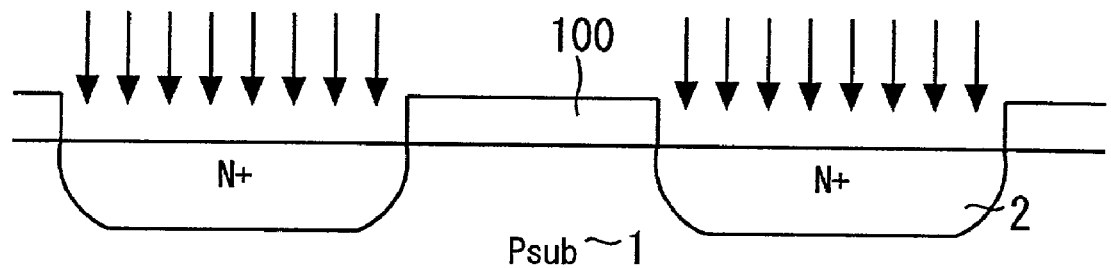
Fig. 26 — Background Art
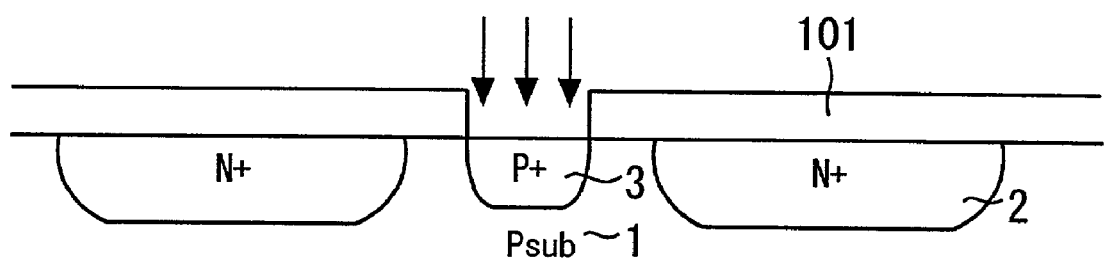
Fig. 27 — Background Art
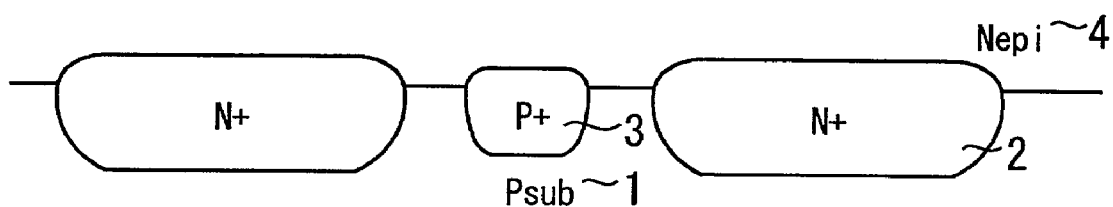

Fig. 28                    Background Art
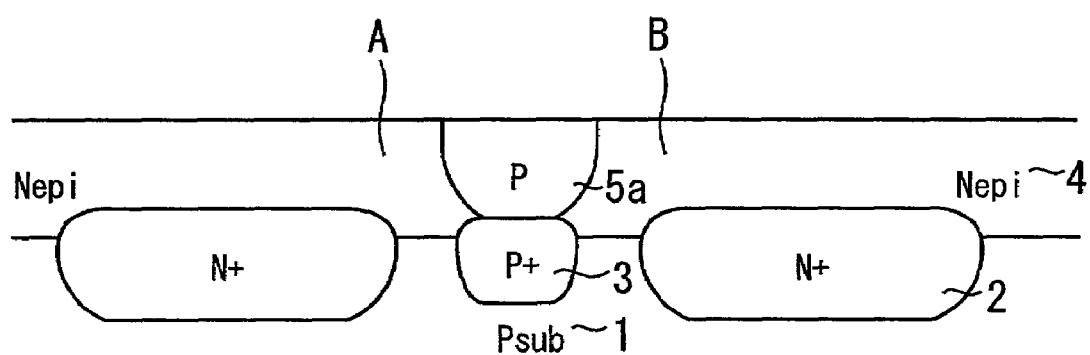
Fig. 29                    Background Art
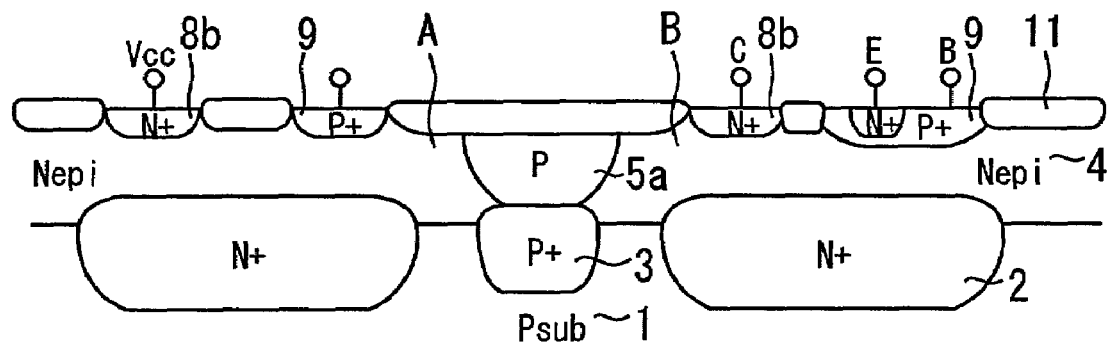

METHOD FOR MANUFACTURING A SEMICONDUCTOR DEVICE HAVING AN ELEMENT ISOLATION REGION

BACKGROUND OF THE INVENTION

1. Field of the Invention

The present invention relates to a semiconductor device and a method for the manufacture thereof. More specifically, the present invention relates to the improvement of latch-up resistance of Bi-CMOS integrated circuits.

2. Description of the Background Art

A Bi-CMOS integrated circuit, in which bipolar transistors and CMOS transistors are formed on a single substrate, has been manufactured.

In recent years, techniques for reducing the size of Bi-CMOS integrated circuits, in particular, techniques for reducing the size of bipolar transistors have been proposed. For example, in order to solve the problem of high occupying ratio of element isolation region in the area where bipolar transistors are formed, there have been proposed a large number of techniques for reducing the size of Bi-CMOS integrated circuits by element isolation using trench forming techniques. However, since trench forming techniques have problems of technical difficulties or manufacturing costs, separation techniques by junction forming have still been used.

A conventional semiconductor device and a method for the manufacture thereof will be described below.

First, a conventional semiconductor device (Bi-CMOS integrated circuit) will be described. FIGS. 23 and 24 are cross-sectional views for illustrating a conventional semiconductor device. Specifically, FIG. 23 shows a first island region in which a p-type diffusion resistor element is formed, a second island region in which an npn transistor is formed, and an element isolation region for isolating these island regions in a conventional Bi-CMOS integrated circuit. FIG. 24 shows a third island region in which a CMOS transistor is formed in a conventional Bi-CMOS integrated circuit.

In FIGS. 23 and 24, the reference numeral 1 represents a p-type silicon substrate, 2 represents an n-type buried diffusion layer, 3 represents a p-type first high-concentration isolation diffusion layer formed in the silicon substrate 1 and for isolating lower layer (deep layer) elements, and 4 represents an n-type epitaxial layer.

The reference numeral 5a represents a p-type low-concentration isolation diffusion layer formed in the epitaxial layer 4 and for isolating upper layer elements. The reference numeral 5b represents a p-type well region, which is formed in a third island region C of the epitaxial layer 4 simultaneously with the low-concentration isolation diffusion layer 5a, and in which an NMOS transistor is formed. The reference numeral 6 represents an n-type well region, which is formed in the third island region C, and in which a PMOS transistor is formed.

The reference numeral 7 represents gate electrodes of the MOS transistors, 8a represents an n-type diffusion region constituting an electrode forming region, 8b represents an n-type diffusion region constituting the bipolar transistor, 8c represents an n-type diffusion region constituting the source-drain region of the NMOS transistor, 9a represents a p-type diffusion region constituting a p-type diffused resistor element, 9b represents a p-type diffusion region constituting the bipolar transistor, 9c represents a p-type diffusion region constituting the source-drain region of the PMOS transistor, and 11 represents a field insulating film.

The reference symbol A represents an n-type first island region, B represents an n-type second island region, C represents a third island region, and Q1, Q2, Q3, and Q4 represent parasitic transistors.

As shown in FIGS. 23 and 24, the epitaxial layer 4 is separated into a plurality of island regions A, B, and C by the low-concentration isolation diffusion layer 5a and the first high-concentration isolation diffusion layer 3 formed in the element-isolation region. The n-type diffusion region 8b is fixed to the normal (ON) potential Vcc. The p-type silicon substrate 1 is fixed to GND (not shown).

Next, a method for manufacturing the above-described semiconductor device will be described below. FIGS. 25 to 29 are cross-sectional views for illustrating a conventional method for manufacturing a semiconductor device.

First, as FIG. 25 shows, a silicon oxide film 100 is formed on a p-type silicon substrate 1. Next, the silicon oxide film 100 is patterned. Then, an n-type impurity is implanted using the silicon oxide film 100 as a mask (hard mask), and the substrate 1 is subjected to annealing (heat treatment). Then the silicon oxide film 100 is removed. Thereby, an n-type buried diffusion layer 2 is formed.

Next, as shown in FIG. 26, a silicon oxide film 101 is formed on the silicon substrate 1. Then, the silicon oxide film 101 is patterned. Furthermore, a p-type impurity is implanted using the silicon oxide film 101 as a mask, and the substrate 1 is subjected to annealing. Then the silicon oxide film 101 is removed. Thereby, a first high-concentration isolation diffusion layer 3 is formed.

Next, as shown in FIG. 27, an n-type epitaxial layer 4 is formed on the silicon substrate 1, the buried diffusion layer 2, and the first high-concentration isolation diffusion layer 3 using the epitaxial method.

Next, as shown in FIG. 28, a low-concentration isolation diffusion layer 5a and a p-type well region 5b (see FIG. 24) are selectively and simultaneously formed using photolithography, the implantation of a p-type impurity, and annealing at a high temperature.

Then, in the same manner as the above-described p-type well region 5b, an n-type well region 6 (see FIG. 24) is selectively formed using photolithography, the implantation of a p-type impurity, and annealing at a high temperature.

Next, as shown in FIG. 29, a field insulating film 11 is formed on the prescribed area of the epitaxial layer 4. Then, gate electrodes 7 (see FIG. 24) are formed on the epitaxial layer 4, and n-type diffusion regions 8a, 8b, and 8c are selectively formed in the epitaxial layer 4. Next, p-type diffusion regions 9a, 9b, and 9c are selectively formed in the epitaxial layer 4. Thereby, a p-type diffused resistor element having the p-type diffusion regions 9a is formed in the first island region A, and a bipolar transistor having the n-type diffusion region 8b is formed in the second island region B.

Also at the same time, an NMOS transistor is formed in the p-type well region 5b, and a PMOS transistor is formed in the n-type well region 6 (see FIG. 24). Thus, a CMOS transistor is formed in the third island region C.

However, the recent downsizing of semiconductor devices has inevitably shortened the distance between junctions, and in the operation of circuits, the operation of parasitic transistors induced in junction separation has not been ignored.

In the above-described conventional semiconductor device, the potential of the p-type diffusion region 9a becomes momentarily higher than the potential of the first island region A in the transient state between ON and OFF of Vcc, and current flows from the p-type diffusion region 9a to the first island region A. Thereby the parasitic pnp transistor Q1 that uses the p-type diffusion region 9a as the emitter, the first island region A as the base, and the low-concentration isolation diffusion layer 5a as the collector operates, and current flows into the low-concentration isolation diffusion layer 5a. Here, when the current flows into the low-concentration isolation diffusion layer 5a, the potential of the low-concentration isolation diffusion layer 5a elevates due to the resistance of the low-concentration isolation diffusion layer 5a itself. Due to the elevation of the potential, the parasitic npn transistor Q2 that uses the second island region B as the emitter, the low-concentration isolation diffusion layer 5a as the base, and the first island region A as the collector conducts.

As described above, when parasitic transistors Q1 and Q2 operate, a continuous excessive current flows between the p-type diffusion region 9 and the second island region B. Thus, the problem of a latch-up phenomenon arises.

Similarly in the third island region C shown in FIG. 24, there is a parasitic pnp transistor Q4 that uses the p-type diffusion region 9c, which is the source-drain region of the PMOS transistor, as the emitter, the n-type well region 6 as the base, and the p-type well region 5b as the collector; and there is a parasitic npn transistor Q3 that uses the buried diffusion layer 2 as the collector, the p-type well region 5b as the base, and the n-type well region 8c, which is the source-drain region of the NMOS transistor, as the emitter. In the transient state between ON and OFF of Vcc, current flows from the p-type diffusion region 9 to the n-type well region 6, and the parasitic pnp transistor Q4 operates. Thereby, current flows in the p-type well region 5b, and the potential of the p-type well region 5b elevates. Since the current gain of parasitic bipolar transistors Q3 and Q4 increases at this time, a continuous excessive current flows between (the source-drain region 9c of) the PMOS transistor and (the source-drain region 8c of) NMOS transistor. Thus, the problem of a latch-up phenomenon arises.

Although increase in the distance between the p-type diffusion region 9 and the low-concentration isolation diffusion layer 5a, or increase in the width of the low-concentration isolation diffusion layer 5a is effective to inhibit the operation of the above-described parasitic transistors, any of these goes against the current requirement of downsizing.

Also in a semiconductor device manufactured by the conventional manufacturing method, the concentration gradient of impurities is formed in the junction between the first high-concentration isolation diffusion layer 3 and the low-concentration isolation diffusion layer 5a, and in the junction between the buried diffusion layer 2 and the p-type well region 5b, depending on the thickness and impurity content of the epitaxial layer 4, and on the conditions of heat treatment (temperature, time). Lowering the temperature and reducing the time of heat-treatment to meet the current requirement of downsizing may result in insufficient diffusion of the impurities in the above-described junctions, and may cause a high-resistance layer to be formed in the above-described junctions.

Therefore, the conduction of the above-described parasitic pnp transistor Q1 causes the potential of the low-concentration isolation diffusion layer 5a to elevate easily. Similarly in the third island region C, the conduction of the parasitic pnp transistor Q4 causes the potential of the p-type well region 5b to elevate easily. Thus, the problem of a high possibility of a latch-up phenomenon arises.

Alternatively, a method for lowering the resistance of the above-described junctions can be considered by increasing the impurity content for forming the low-concentration isolation diffusion layer 5a, or by increasing the time for heat treatment after the implantation of impurities. However, since the low-concentration isolation diffusion layer 5a is formed simultaneously with the p-type well region 5b of the NMOS transistor, the driving ability of the NMOS transistor takes precedence. Furthermore, since the low-concentration isolation diffusion layer 5a is formed considering the control of side diffusion to inhibit the isolating width. In other words, since increase in impurity content or heat-treatment time leads to the deterioration of the performance of the NMOS transistor, and to increase in the element area of the bipolar transistor, the problem of going against the improvement of performance by downsizing.

SUMMARY OF THE INVENTION

The present invention has been conceived to solve the previously-mentioned problems and a general object of the present invention is to provide a novel and semiconductor device and to provide a novel and useful method for manufacturing a semiconductor device.

A more specific object of the present invention is to provide a semiconductor device with improved latch-up resistance by inhibiting the operation of parasitic transistors without increasing the element area, and is to form an element separation of low resistance that does not depend on the thickness and impurity content of the epitaxial layer, and on the conditions of heat treatment.

The above object of the present invention is attained by a following method of manufacturing a semiconductor device and a following semiconductor device.

According to a first aspect of the present invention, the semiconductor device comprises: a substrate of a first conductivity type; a buried diffusion layer of a second conductivity type formed in the surface layer of the prescribed area of the substrate; a first high-concentration isolation diffusion layer of the first conductivity type formed in the substrate so as to surround the buried diffusion layer; an epitaxial layer of the second conductivity type formed on the substrate, the buried diffusion layer, and the first high-concentration isolation diffusion layer; a second high-concentration isolation diffusion layer of the first conductivity type formed in the epitaxial layer on the first high-concentration isolation diffusion layer; and a low-concentration isolation diffusion layer of the first conductivity type formed on the second high-concentration isolation diffusion layer, for isolating the epitaxial layer into a plurality of island regions.

According to a second aspect of the present invention, the semiconductor device comprises: a substrate of a first conductivity type; a buried diffusion layer of a second conductivity type formed in the surface layer of the prescribed area of said substrate; an epitaxial layer of the second conductivity type formed on the substrate and the buried diffusion layer; a high-concentration diffusion layer of the first conductivity type formed on the prescribed area of the buried diffusion layer; a first diffusion layer of the first conductivity type formed in the epitaxial layer on the high-concentration diffusion layer; and a second diffusion layer of the second conductivity type formed in the epitaxial layer on the buried diffusion layer adjacent to the first diffusion layer.

According to a third aspect of the present invention, the method for manufacturing a semiconductor device, comprises the steps of: forming a buried diffusion layer of a second conductivity type in the surface layer of the prescribed area of a substrate of a first conductivity type; forming a first high-concentration isolation diffusion layer of the first conductivity type in the substrate so as to surround the buried diffusion layer: forming an epitaxial layer of the second conductivity type on the substrate, the buried diffusion layer, and the first high-concentration isolation diffusion layer; forming a low-concentration isolation diffusion layer of the first conductivity type in the epitaxial layer on the first high-concentration isolation diffusion layer, the low-concentration isolation diffusion layer isolating the epitaxial layer into a plurality of island regions; and forming a second high-concentration isolation diffusion layer of the first conductivity type in the junction area between the first high-concentration isolation diffusion layer and the low-concentration isolation diffusion layer.

Other objects and further features of the present invention will be apparent from the following detailed description when read in conjunction with the accompanying drawings.

BRIEF DESCRIPTION OF THE DRAWINGS

FIGS. 25 to 29 are cross-sectional views for illustrating a conventional method for manufacturing a semiconductor device.

DETAILED DESCRIPTION OF THE PREFERRED EMBODIMENTS

Figure 1:
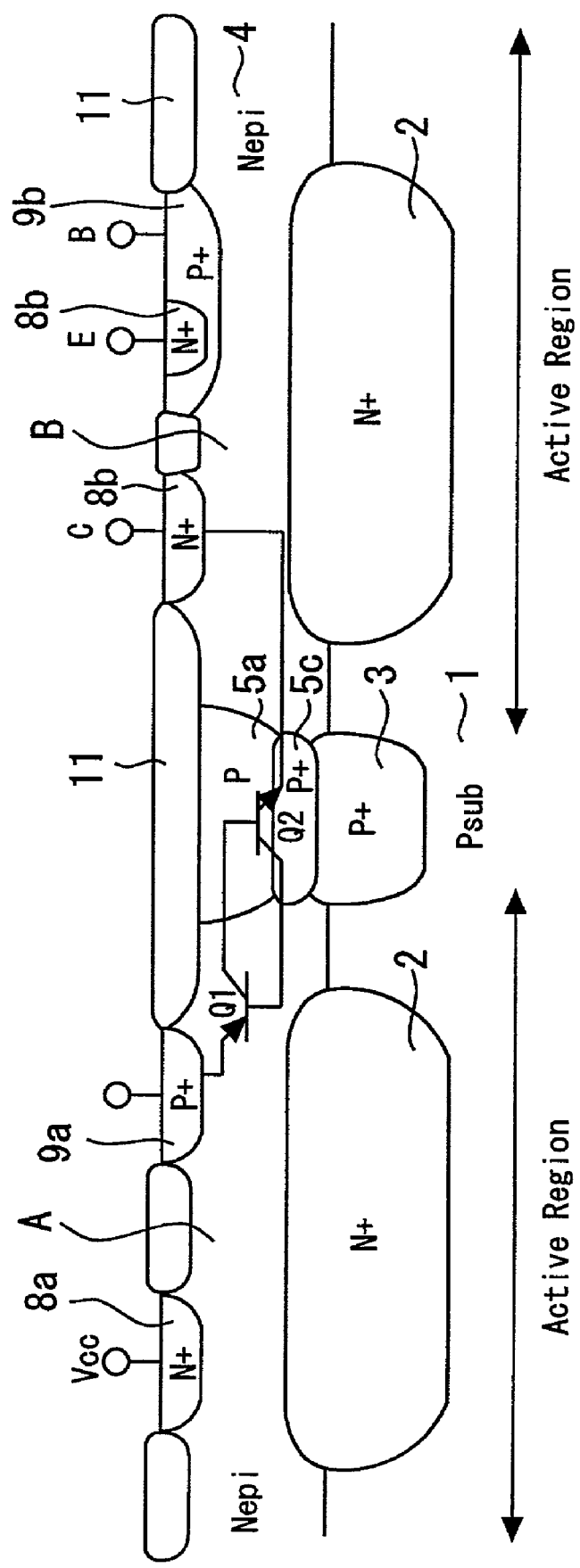
FIGS. 1 and 2 are cross-sectional views for describing a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2:
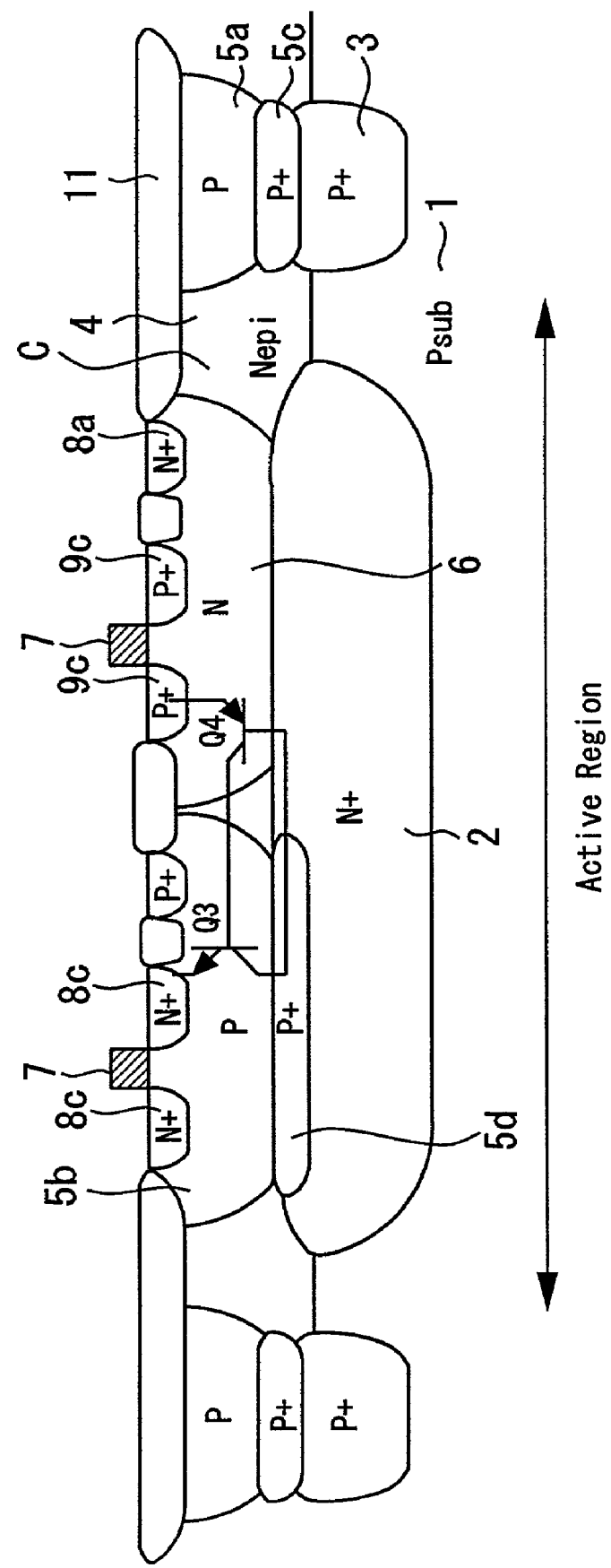

First a semiconductor device will be described. FIGS. 1 and 2 are cross-sectional views for illustrating a semiconductor device according to a first embodiment of the present invention. Specifically, FIG. 1 shows, in a Bi-CMOS integrated circuit according to the first embodiment, a first island region A in which a p-type diffused resistor element is formed, a second island region B in which an npn transistor is formed, and an element isolation region for isolating the first and second island regions. FIG. 2 shows, in a Bi-CMOS integrated circuit according to the first embodiment, a third island region C in which a CMOS transistor is formed.

In FIGS. 1 and 2, the reference numeral 1 represents a substrate, for example, a p-type silicon substrate; 2 represents an n-type buried diffusion layer, 3 represents a p-type first high-concentration isolation diffusion layer formed in the silicon substrate 1 and for isolating lower layer (deep layer) elements, and 4 represents an n-type epitaxial layer. In the present embodiment, "p-type" corresponds to "first conductivity", and "n-type" corresponds to "second conductivity" (the same also applies to the second and third embodiments to be described later).

The reference numeral 5a represents a p-type low-concentration isolation diffusion layer formed in the epitaxial layer 4 on a second high-concentration isolation diffusion layer 5c (described below) and for isolating upper layer elements. The reference numeral 5b represents a p-type well region, which is formed in a third island region C of the epitaxial layer 4 on the high-concentration isolation diffusion layer 5d and for forming an NMOS transistor. The reference numeral 5c represents a p-type second high-concentration isolation diffusion layer formed in the epitaxial layer 4 on the first high-concentration diffusion layer 3; 5d represents a p-type high-concentration isolation diffusion layer formed on the upper layer of the prescribed area of the buried diffusion layer 2. The reference numeral 6 represents an n-type well region, which is formed in the third island region C adjacent to the p-type well region 5b, and in which a PMOS transistor is formed.

The reference numeral 7 represents gate electrodes of the MOS transistors, 8a represents an n-type diffusion region constituting an electrode forming region, 8b represents an n-type diffusion region constituting the bipolar transistor, 8c represents an n-type diffusion region constituting the source-drain region of the NMOS transistor, 9a represents a p-type diffusion region constituting a p-type diffused resistor element, 9b represents a p-type diffusion region constituting the bipolar transistor, 9c represents a p-type diffusion region constituting the source-drain region of the PMOS transistor, and 11 represents a field insulating film.

As shown in FIGS. 1 and 2, the epitaxial layer 4 is separated into a plurality of island regions A, B, and C by the low-concentration isolation diffusion layer 5a, the first high-concentration isolation diffusion layer 3, and the second high-concentration isolation diffusion layer 5c. The silicon substrate 1 is fixed to GND (not shown), and the n-type diffusion region 8a formed in the first island region A is fixed to the normal (ON) potential Vcc. The n-type diffusion region 8a formed in the n-type well region 6 is also fixed to the normal (ON) potential Vcc.

As described above, the above-described semiconductor device comprises a second p-type high-concentration isolation diffusion layer 5c in the junction between the low-concentration isolation diffusion layer 5a and the first high-concentration isolation diffusion layer 3. The second high-concentration isolation diffusion layer 5c has a higher impurity content and a lower resistance than the low-concentration isolation diffusion layer 5a. Therefore, even if a current flows in the low-concentration isolation diffusion layer 5a due to the operation of the parasitic pnp transistor Q1, the second high-concentration isolation diffusion layer 5c allows the current to flow in the silicon substrate 1 connected to GND while inhibiting the elevation of the potential of the first high-concentration isolation diffusion layer 3 and the low-concentration isolation diffusion layer 5a. In other words, the elevation of potential at the above-described junction can be inhibited. The operation of the parasitic npn transistor Q2 is inhibited, thereby preventing latch-up. Therefore, continuous excessive current flowing between the p-type diffusion region 9 and the active island region B is inhibited, and the latch-up resistance can be improved.

The above-described semiconductor device also comprises a p-type high-concentration diffusion layer 5d in the junction between the n-type buried diffusion layer 2 and the p-type well region 5b. The high-concentration diffusion layer 5d has a higher impurity content and a lower resistance than the p-type well region 5b. Therefore, even if a current flows in the p-type well region 5b due to the operation of the parasitic pnp transistor Q4, the high-concentration diffusion layer 5d allows the current to flow in the silicon substrate 1 connected to GND while inhibiting the elevation of the potential of the p-type well region 5b. That is, the elevation of potential at the above-described junction can be inhibited. The operation of the parasitic npn transistor Q4 is inhibited, thereby preventing latch-up between the first island region A and the second island region B. In other words, the current gain of the parasitic transistors Q3 and Q4 can be minimized, and the latch-up resistance can be improved.

Next, a method for manufacturing the above-described semiconductor device will be described below. FIGS. 3 to 10 are cross-sectional views for illustrating a method for manufacturing a semiconductor device according to a first embodiment.

Figure 3:
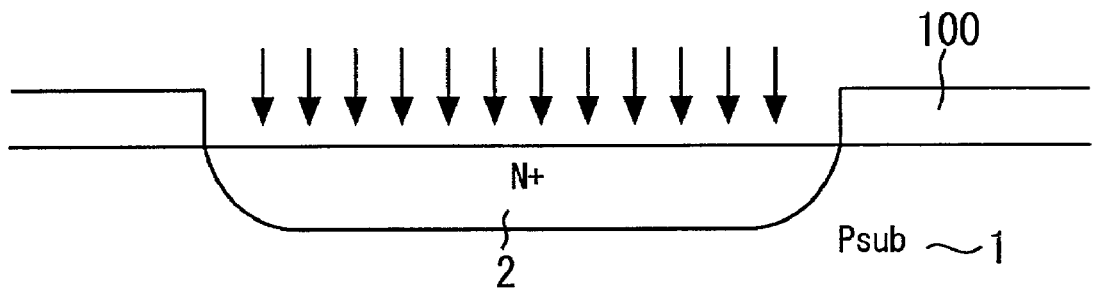
FIGS. 3 to 10 are cross-sectional views for illustrating a method for manufacturing a semiconductor device according to a first embodiment of the present invention.

First, as shown in FIG. 3, a silicon oxide film 100 is formed on a silicon substrate 1. Next, the silicon oxide film 100 is patterned using photolithography. Then, an n-type impurity is implanted into the silicon substrate 1 using the patterned silicon oxide film 100 as the mask. Furthermore, the silicon substrate 1 is annealed to diffuse the n-type impurity. Then, the silicon oxide film 100 is removed. Thereby, an buried diffusion layer 2 is formed in the upper layer of the prescribed area of the silicon substrate 1.

Figure 4:
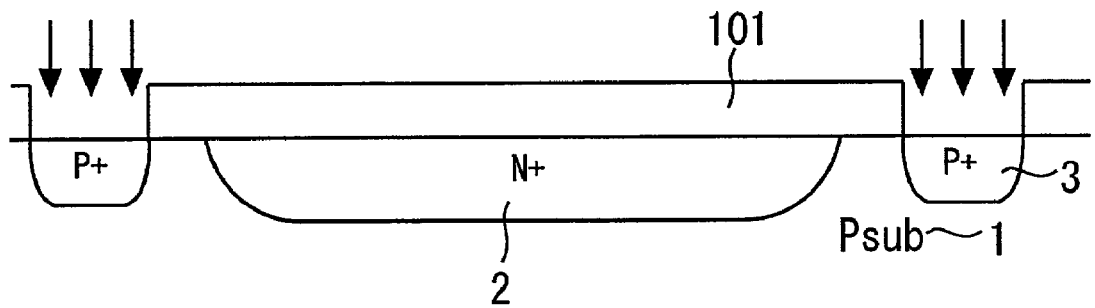

Next, as shown in FIG. 4, a silicon oxide film 101 is formed on the silicon substrate 1. Then, the silicon oxide film 101 is patterned using photolithography. Furthermore, a p-type impurity is implanted into the silicon substrate 1 using the patterned silicon oxide film 101 as the mask. Then, the silicon substrate 1 is annealed to diffuse the p-type impurity. Then, the silicon oxide film 101 is removed. Thereby, a first high-concentration isolation diffusion layer 3 is formed in the silicon substrate 1 so as to surround the buried diffusion layer 2.

Figure 5:
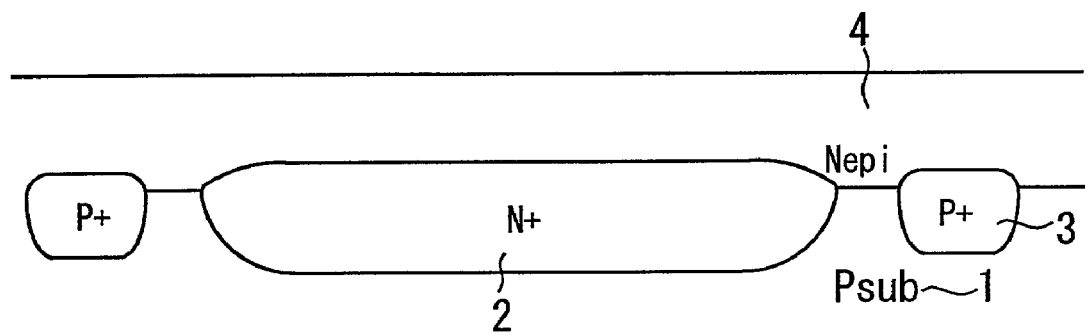

Then, as shown in FIG. 5, an epitaxial layer 4 of a thickness of, for example, 1.0 to 4.0 μm is formed on the silicon substrate 1, the buried diffusion layer 2, and the first high-concentration isolation diffusion layer 3 using the epitaxial method.

Figure 6:
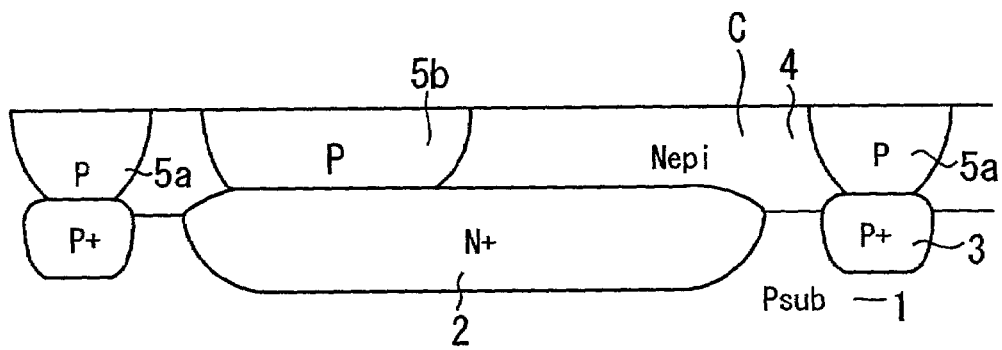

Next, as shown in FIG. 6, a low-concentration isolation diffusion layer 5a is formed in the epitaxial layer 4 on the first high-concentration isolation diffusion layer 3 by photolithography, the implantation of a p-type impurity, and annealing. At the same time, a p-type well region 5b, in which an NMOS transistor is formed, is formed in the epitaxial layer 4 on the prescribed area of the buried diffusion layer 2.

Figure 7:
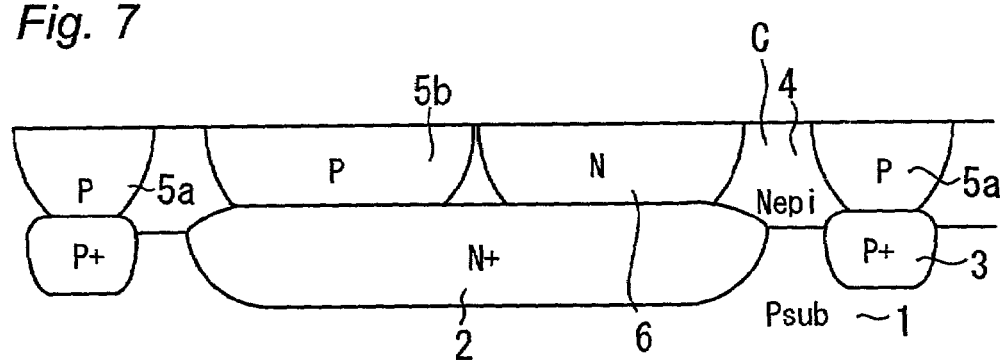

Then, as shown in FIG. 7, an n-type well region 6, in which a PMOS transistor is formed, is formed in the epitaxial layer 4 on the buried diffusion layer 2 adjacent to the p-type well region 5b by photolithography, the implantation of an n-type impurity, and annealing.

Figure 8:
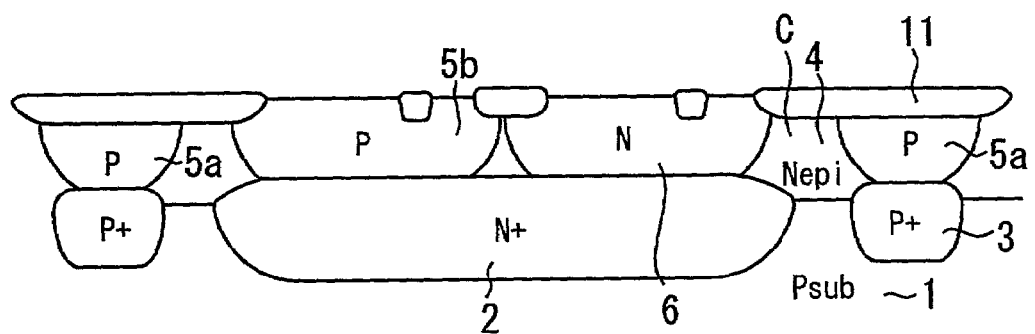

Next, as shown in FIG. 8, field-insulating films 11 for isolating elements are formed on the surface layer of a prescribed areas of the epitaxial layer 4 using the LOCOS method.

Figure 9:
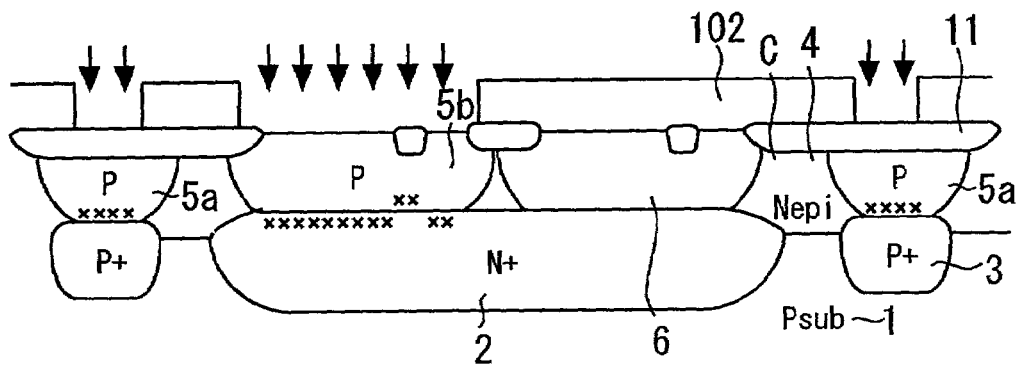

Next, as shown in FIG. 9, a resist pattern 102 of a thickness of, for example, 1.0 to 3.0 μm is formed on the epitaxial layer 4 using photolithography. At this time, the photo mask for forming the above-described low-concentration isolation diffusion layer 5a and p-type well region 5b is used as a photo mask for forming the resist pattern 102.

Then, a p-type impurity, such as boron, is implanted into the epitaxial layer 4 using the resist pattern 102 as the mask at an accelerating voltage of 350 to 500 keV, and a dose of 1.0 E12 to 3.0E13/cm.

Furthermore, the silicon substrate 1 is annealed to diffuse the p-type impurity.

Figure 10:
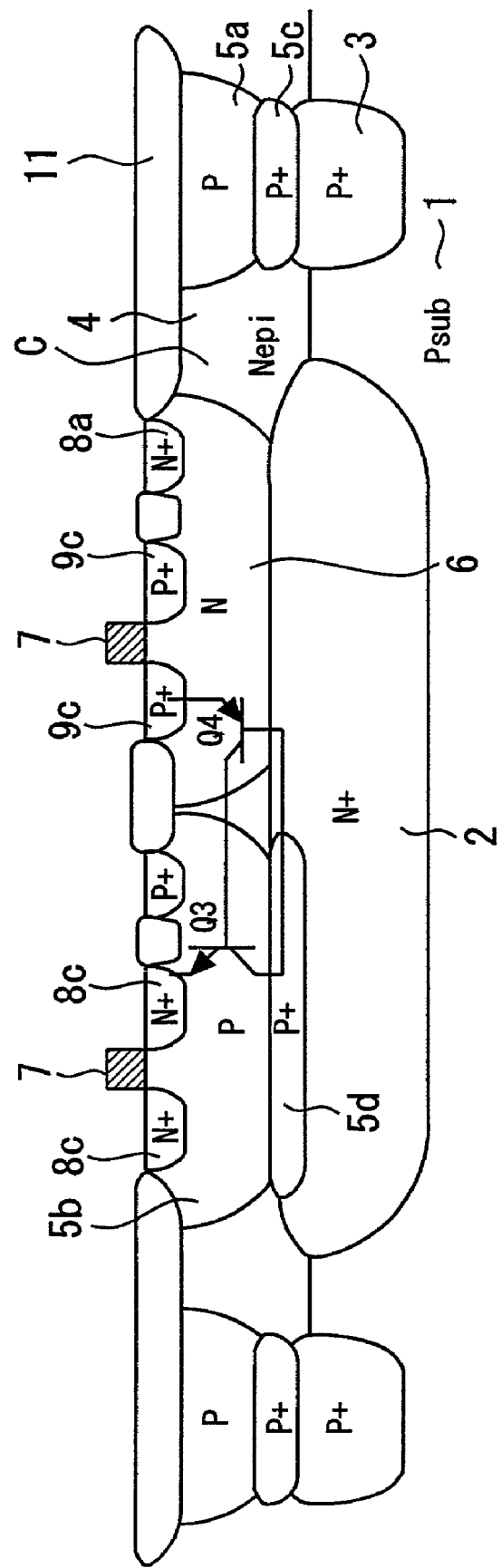

Thereby, a high-concentration diffusion layer 5d is formed in the junction between the p-type well region 5b and the buried diffusion layer 2, and a second high-concentration isolation diffusion layer 5c is formed in the junction between the low-concentration isolation diffusion layer 5a and the first high-concentration isolation diffusion layer 3 (see FIG. 10).

Next, as shown in FIG. 10, a gate electrode 7 is formed, and n-type diffusion regions 8a, 8b, and 8c are selectively formed. Next, p-type diffusion regions 9a, 9b, and 9c are selectively formed. Thereby, an NMOS transistor is formed in the p-type well region 5b, and a PMOS transistor is formed in the n-type well region 6. In other words, a CMOS transistor is formed in the third island region C.

At the same time, a p-type diffused resistor element having a p-type diffusion region 9a is also formed in the first island region A, and a bipolar transistor having an n-type diffusion region 8b is formed in the second island region B (see FIG. 1).

As described above, in the first embodiment, a p-type high-concentration diffusion layer 5c of a low resistance is formed in the junction between the low-concentration isolation diffusion layer 5a and the first high-concentration isolation diffusion layer 3. Thereby when a junction separation is formed by low-temperature heat treatment to meet downsizing, even if annealing is performed at a low temperature after implanting an impurity for forming the low-concentration isolation diffusion layer 5a, the elevation of the resistance of the junction seen in the conventional semiconductor device can be prevented, and an element separation of a low resistance can be formed. Therefore, an element separation of a low resistance, which does not depend on the thickness and the impurity content of the epitaxial layer 4 and on heat-treatment conditions, can be formed Also, since the element separation can be formed by a low-temperature heat treatment, the element separation width does not increase, and the element area does not enlarge. Therefore, the operation of parasitic transistors can be inhibited, and resistance to latch-up can be improved.

In the first embodiments, a high-concentration diffusion layer 5d of a low resistance is also formed in the junction between the p-type well region 5b and the buried diffusion layer 2 in the third island region C. Thereby, even when the p-type well region 5b is formed by low-temperature heat treatment to meet downsizing, the elevation of the resistance of the junction seen in the conventional semiconductor device can be prevented. Therefore, the elevation of the potential of the junction between the p-type well region 5b and the buried diffusion layer 2 can be inhibited. For this reason, even if a parasitic transistor Q4 operates, the operation of the parasitic transistor Q3 can be inhibited, and resistance to latch-up can be improved.

Even if the low-concentration isolation diffusion layer 5a is not necessarily joined with the first high-concentration isolation diffusion layer 3 by low-temperature heat treatment to meet downsizing, the present invention is effective, and is an essential technique for forming fundamental element separation.

Here, as an example of the low-temperature heat treatment, the maximum temperature of the heat treatment is lowered to 850° C. or below from 950° C. employed in the prior art. However, the above-described low-temperature heat treatment is not only lowering the maximum temperature, but also lowering the temperature of the entire heat treatment. Therefore, the heat treatment at a lower temperature than the maximum temperature is included, and the integral sum with the heat-treatment time is decreased compared with the prior art.

Also in the first embodiment, the photo mask for forming the low-concentration isolation diffusion layer 5a and the p-type well region 5b can be used as the photo mask for forming the second high-concentration isolation diffusion layer 5c and the high-concentration diffusion layer 5d. Therefore, no additional photo masks are required, and the elevation of manufacturing costs can be inhibited.

Also, a method for manufacturing a semiconductor device, comprises the steps of: forming an buried diffusion layer of a second conductivity type in the surface layer of the prescribed area of a first conductivity type; forming a first high-concentration isolation diffusion layer of the first conductivity type in said substrate so as to surround the buried diffusion layer; forming an epitaxial layer of the second conductivity type on the substrate, the buried diffusion layer, and the first high-concentration isolation diffusion layer; forming a low-concentration isolation diffusion layer of the first conductivity type in the epitaxial layer on the first high-concentration isolation diffusion layer, and simultaneously forming a first diffusion layer of the first conductivity type in the epitaxial layer on the buried diffusion layer; forming a second diffusion layer of the second conductivity type in the epitaxial layer on the buried diffusion layer adjacent to the first diffusion layer; and forming a second high-concentration isolation diffusion layer of the first conductivity type in the junction area between the first high-concentration isolation diffusion layer and the low-concentration isolation diffusion layer, and simultaneously forming a high-concentration diffusion layer of the first conductivity type in the junction area between the buried diffusion layer and the first diffusion layer.

The method for manufacturing a semiconductor device, further comprises the steps of: forming, after formation of the high-concentration diffusion layer, a first circuit element having a diffusion region of the second conductivity type in the first diffusion layer; and forming a second circuit element having a diffusion region of the first conductivity type in the second diffusion layer.

Second Embodiment

Figure 11:
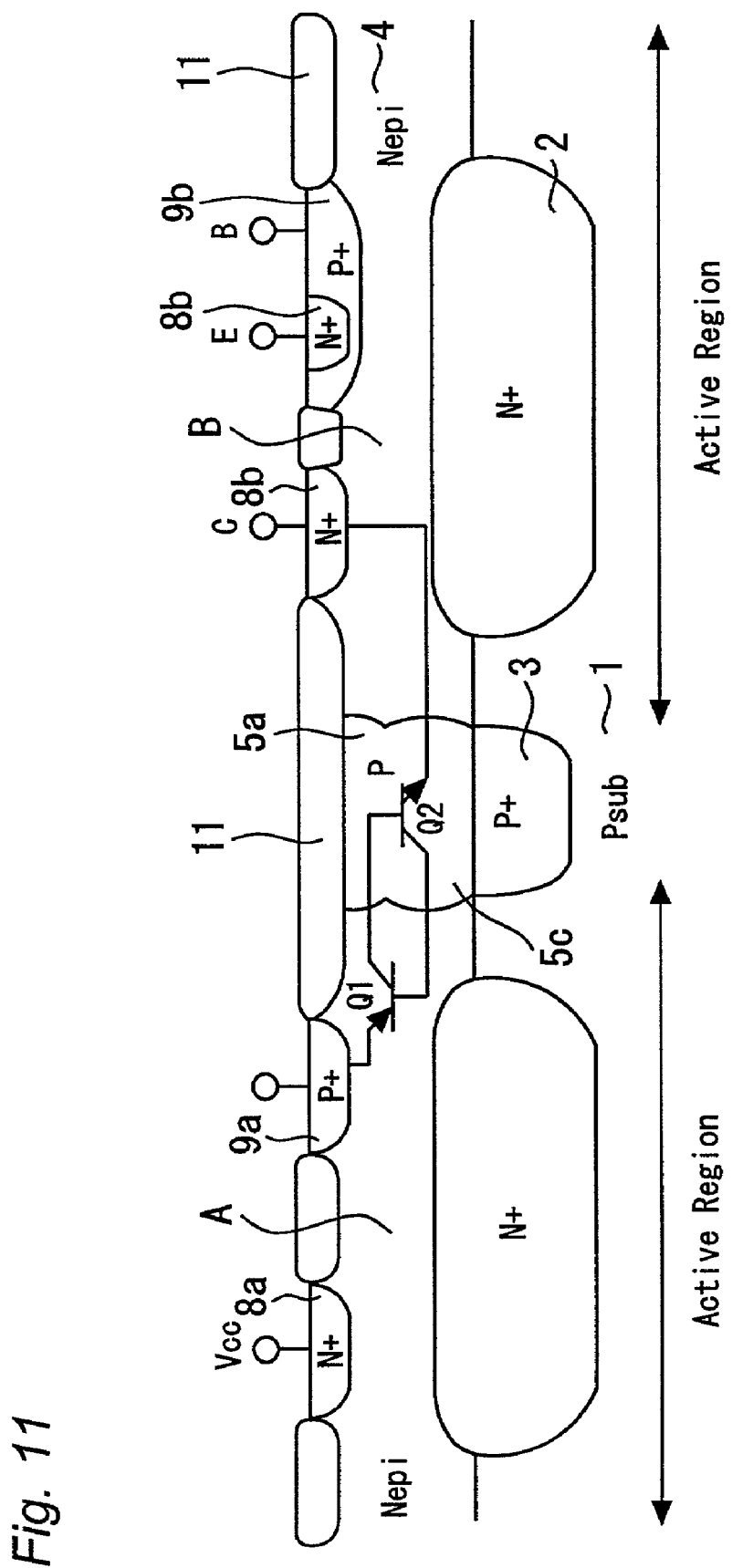
FIGS. 11 and 12 are cross-sectional views for illustrating a semiconductor device according to a second embodiment of the present invention.
Figure 12:
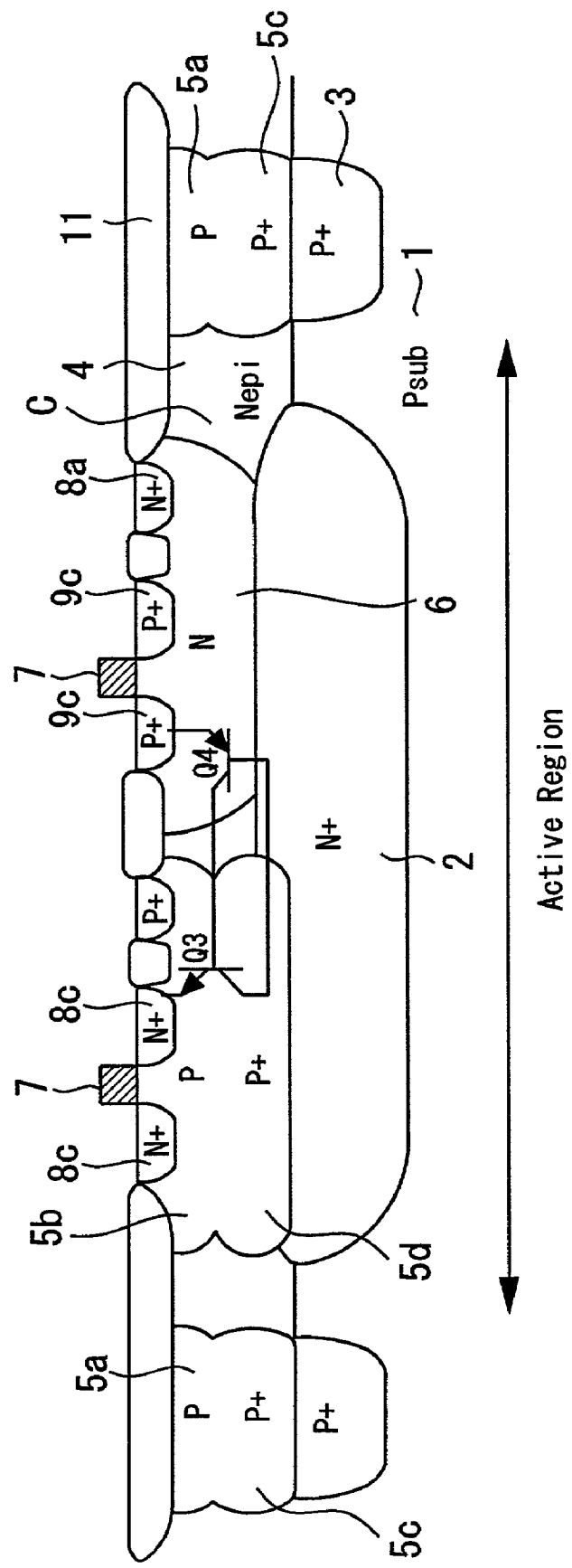

FIGS. 11 and 12 are cross-sectional views for illustrating a semiconductor device according to a second embodiment of the present invention. Specifically, FIG. 11 shows, in a Bi-CMOS integrated circuit according to the second embodiment, a first island region A in which a p-type diffused resistor element is formed, a second island region B in which an npn transistor is formed, and an element isolation region for isolating the first and second island regions. FIG. 12 shows, in a Bi-CMOS integrated circuit according to the second embodiment, a third island region C in which a CMOS transistor is formed.

In the above-described first embodiment, the low-concentration isolation diffusion layer 5a and the p-type well region 5b, and the second high-concentration isolation diffusion layer 5c and the high-concentration diffusion layer 5d are formed in separate processes. However, in the second embodiment, they are formed in the same process.

Therefore, the structure of the semiconductor device according to the second embodiment is substantially the same as the structure according to the first embodiment. Consequently, the same effect as the first embodiment can be obtained. The description of the semiconductor device according to the second embodiment will be omitted.

Next, a method for manufacturing a semiconductor device according to a second embodiment will be described below.

FIGS. 13 to 20 are cross-sectional views for illustrating a method for manufacturing a semiconductor device according to a second embodiment.

Figure 13:
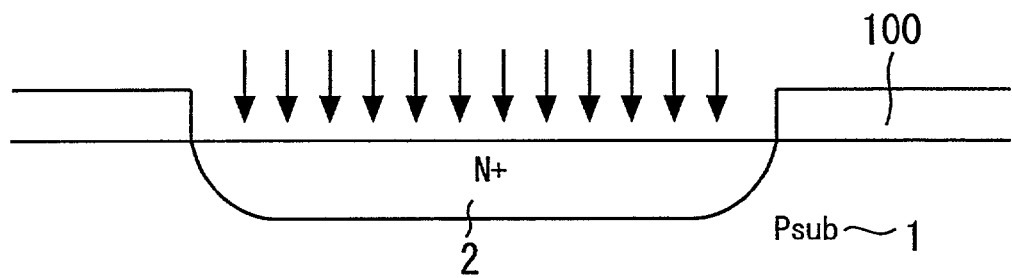
FIGS. 13 to 20 are cross-sectional views for illustrating a method for manufacturing a semiconductor device according to a second embodiment.
Figure 14:
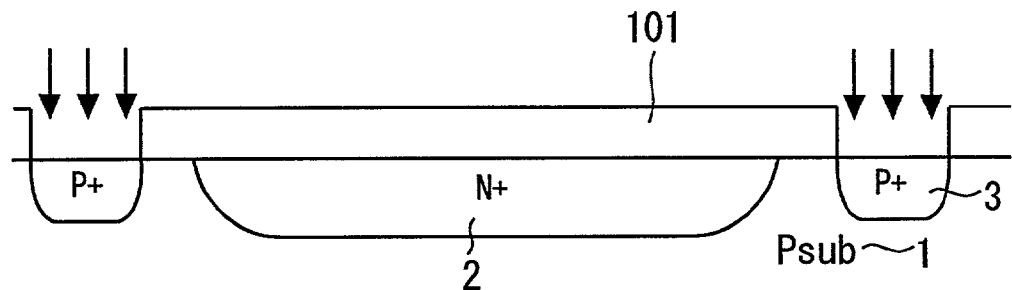
Figure 15:
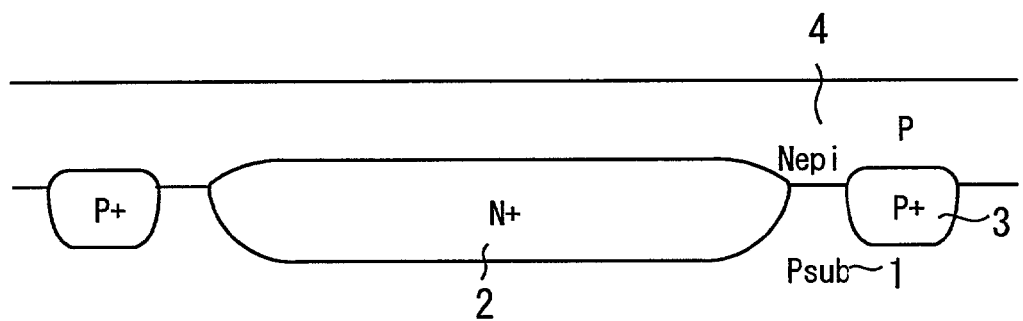

First, the process steps shown in FIGS. 13 to 15 are carried out. Since the process steps shown in FIGS. 13 to 15 are the same as the process steps shown in FIGS. 3 to 5, no descriptions will be required.

Figure 16:
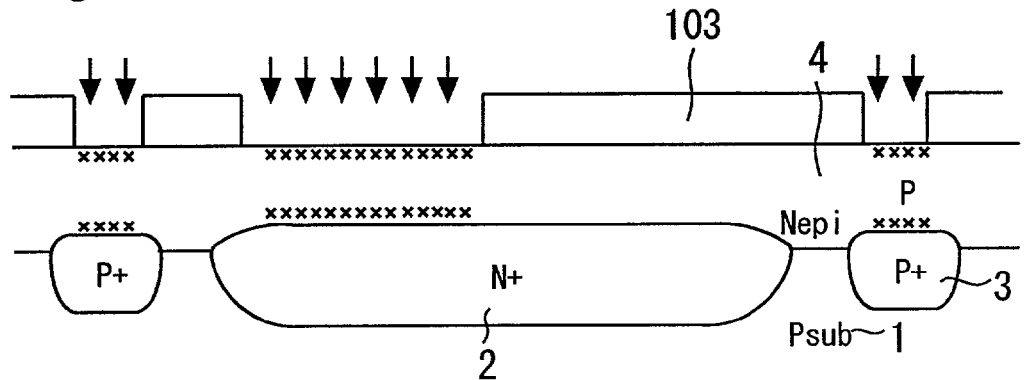

Next, as shown in FIG. 16, a resist pattern 103 of a thickness of, for example, 1.0 to 3.0 μm is formed on the epitaxial layer 4.

Then, a p-type impurity, such as boron, is implanted into the upper layer of the epitaxial layer 4 using the resist pattern 103 as the mask at an accelerating voltage of 300 to 400 keV or below, and a dose of 1.0 E12 to 1.0 E13/cm or below.

Furthermore, a p-type impurity, such as boron, is implanted into the lower layer of the epitaxial layer 4 using the resist pattern 103 as the mask at an accelerating voltage of 350 to 500 keV, and a dose of 1.0 E12 to 3.0 E13/cm. Thereby, the second impurity is implanted into the location 0.2 to 0.3 μm deeper than the location where the first impurity has been implanted.

The conditions of the above-described two impurity implantations are determined depending on the optimization of characteristics of the MOS transistor.

Next, the silicon substrate 1 is annealed to diffuse the p-type impurity that has been implanted in two implantation steps.

Figure 17:
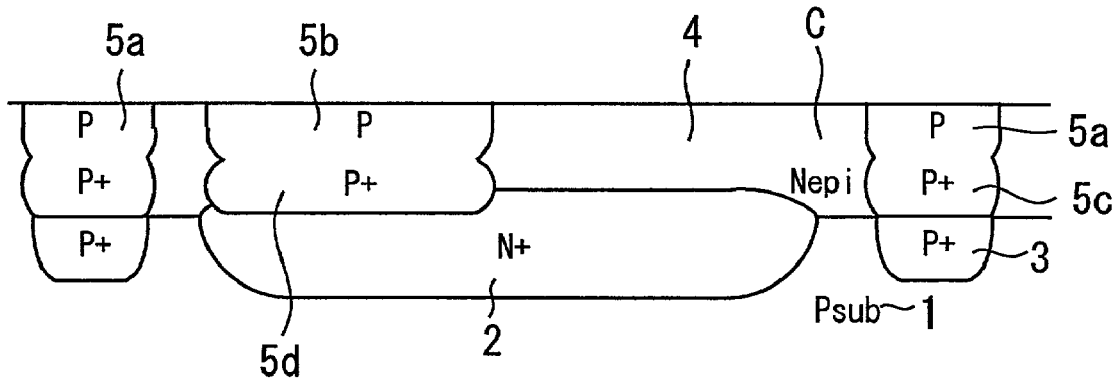

Thereby, as shown in FIG. 17, a low-concentration isolation diffusion layer 5a and a p-type well region 5b are formed in the upper layer of the epitaxial layer 4, and a second high-concentration isolation diffusion layer 5c and a high-concentration diffusion layer 5d are formed in the lower layer of the epitaxial layer 4.

Figure 18:
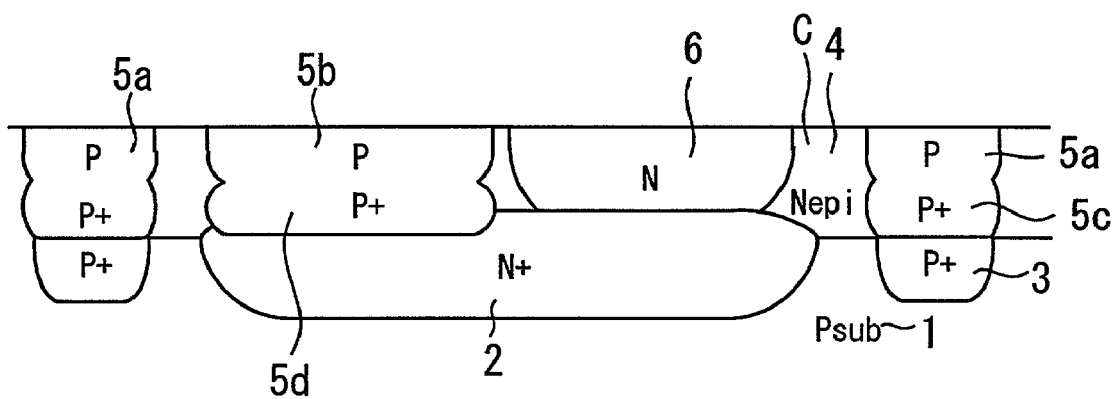

Next, as shown in FIG. 18, an n-type well region 6 is formed in the epitaxial layer 4 on the n-type buried diffusion layer 2 adjacent to the p-type well region 5b by photolithography, the implantation of an n-type impurity, and high-temperature annealing.

Figure 19:
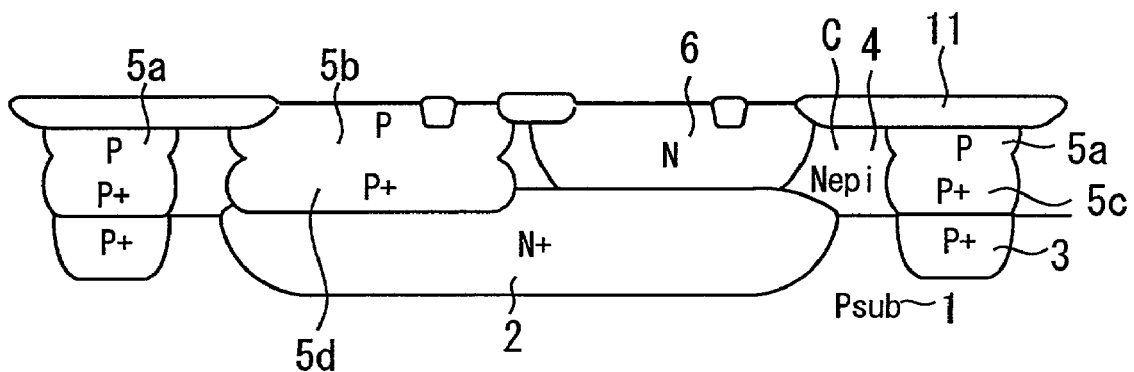

Then, as shown in FIG. 19, field-insulating films 11 for isolating elements are formed on the prescribed areas of the epitaxial layer 4 using the LOCOS method.

Figure 20:
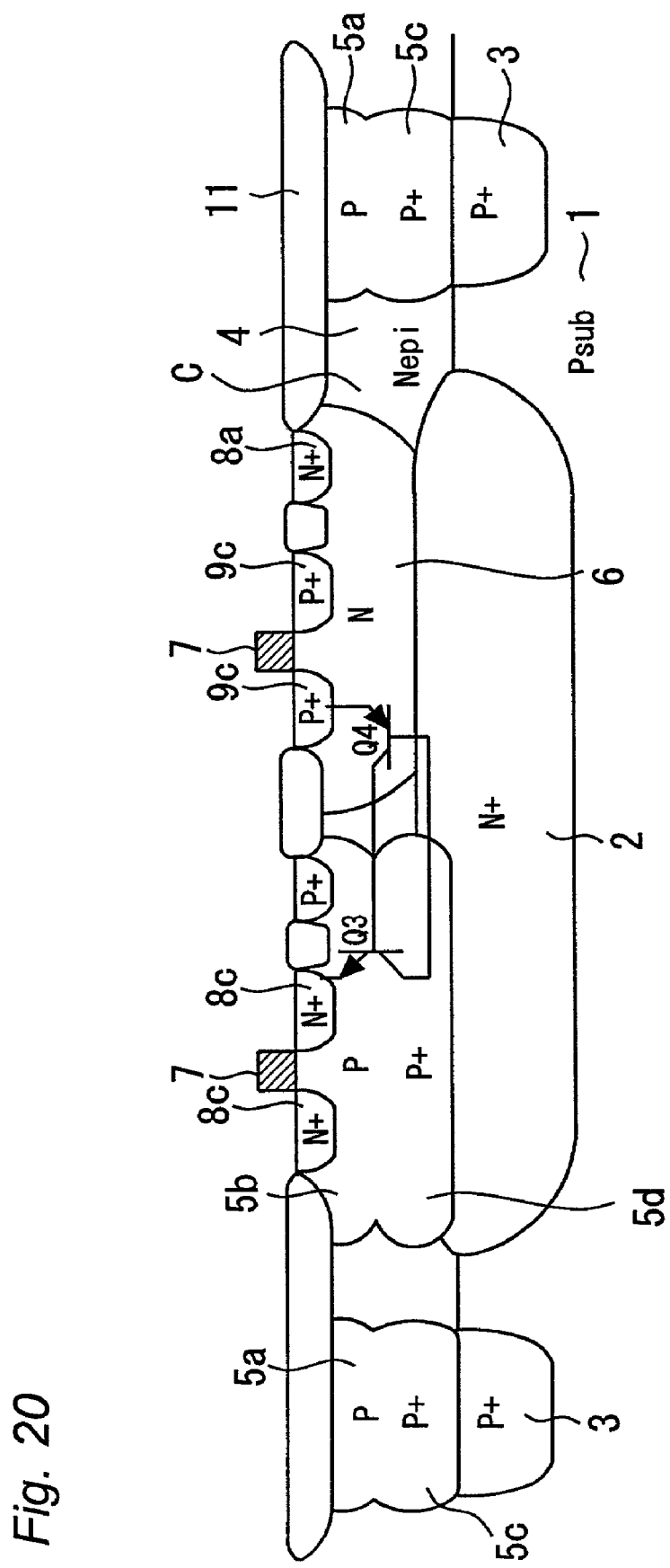

Next, as shown in FIG. 20, a gate electrode 7 is formed, and n-type diffusion regions 8a, 8b, and 8c are selectively formed. Next, p-type diffusion regions 9a, 9b, and 9c are selectively formed. Thereby, an NMOS transistor is formed in the p-type well region 5b, and a PMOS transistor is formed in the n-type well region 6. In other words, a CMOS transistor is formed in the third island region C.

At the same time, a p-type diffused resistor element having a p-type diffusion region 9a is also formed in the first island region A, and a bipolar transistor having an n-type diffusion region 8b is formed in the second island region B (see FIG. 11).

As described above, in the second embodiment, after the epitaxial layer 4 has been formed, an impurity is implanted twice using the same resist pattern 103 in two different heights, and the impurity implanted in different locations is simultaneously diffused by heat. Thereby, the low-concentration isolation diffusion layer 5a, the p-type well region 5b, the second high-concentration isolation diffusion layer 5c, and the high-concentration diffusion layer 5d can be formed simultaneously.

Therefore, one resist pattern forming step, and one annealing step can be decreased from the first embodiment. Thereby, the manufacturing costs can be reduced.

Third Embodiment

Figure 21:
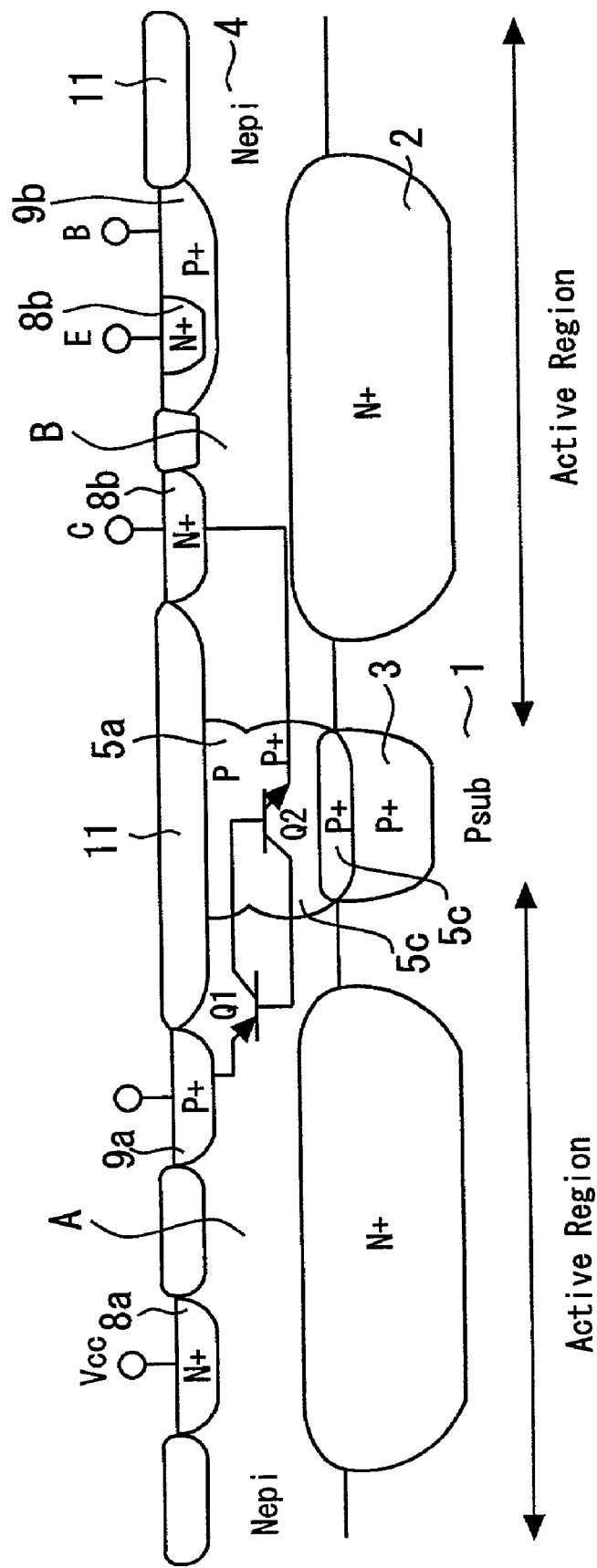
FIGS. 21 and 22 are cross-sectional views for illustrating a semiconductor device according to a third embodiment of the present invention.
Figure 22:
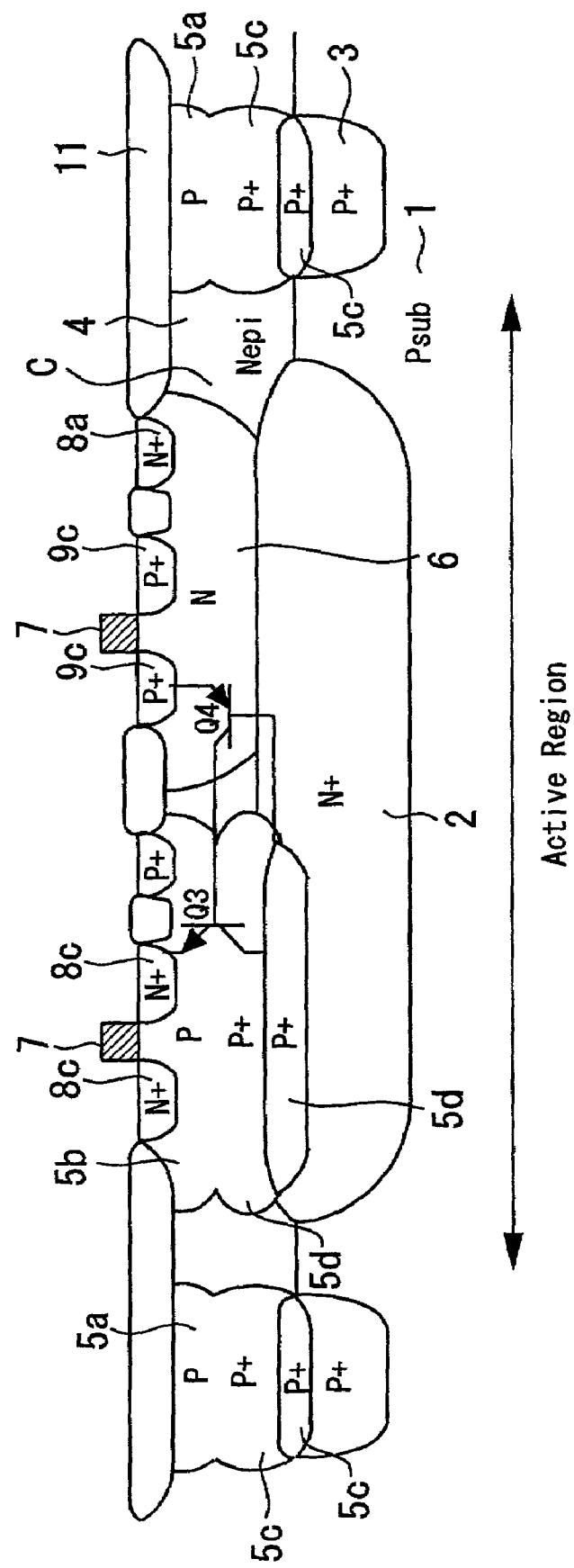
Figure 23:
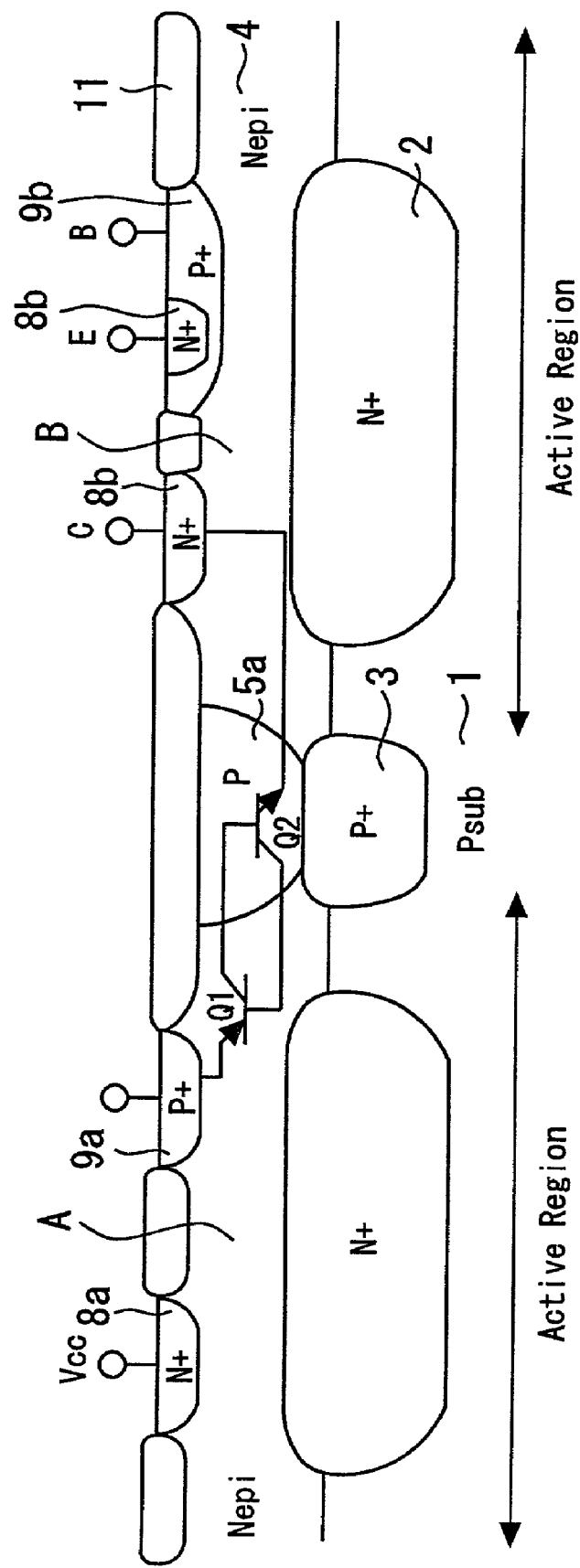
FIGS. 23 and 24 are cross-sectional views for illustrating a conventional semiconductor device.
Figure 24:
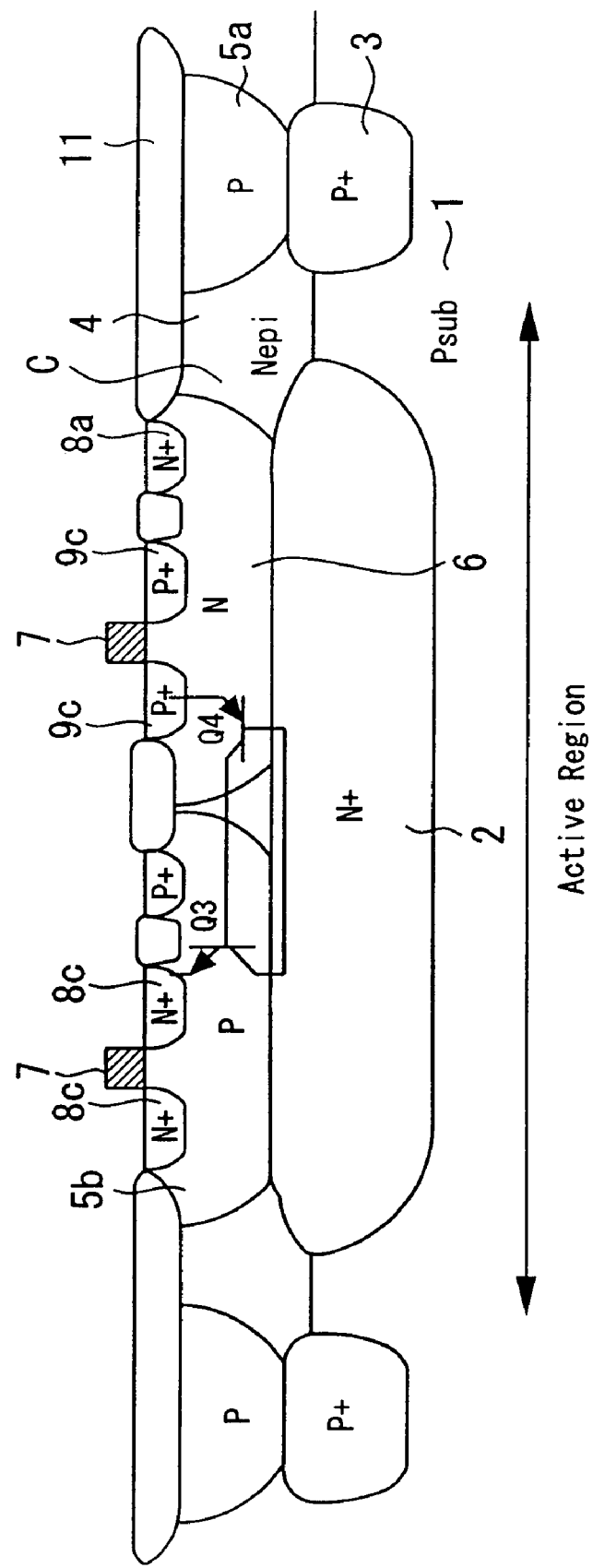

FIGS. 21 and 22 are cross-sectional views for illustrating a semiconductor device according to a third embodiment of the present invention. Specifically, FIG. 21 shows, in a Bi-CMOS integrated circuit according to the third embodiment, a first island region A in which a p-type diffused resistor element is formed, a second island region B in which an npn transistor is formed, and an element isolation region for isolating the first and second island regions. FIG. 22 shows, in a Bi-CMOS integrated circuit according to the third embodiment, a third island region C in which a CMOS transistor is formed.

In the third embodiment, the method for manufacturing the second high-concentration isolation diffusion layer 5c and the high-concentration diffusion layer 5d according to the first embodiment, and the method for manufacturing the second high-concentration isolation diffusion layer 5c and the high-concentration diffusion layer 5d according to the second embodiment are used in combination.

According to the third embodiment, the second high-concentration isolation diffusion layer 5c is formed between the low-concentration isolation diffusion layer 5a and the first high-concentration isolation diffusion layer 3. Also, the high-concentration diffusion layer 5d is formed between the p-type well region 5b and the buried diffusion layer 2. Therefore, the same effect as the first embodiment can be obtained.

This invention, when practiced illustratively in the manner described above, provides the following major effects:

According to the present invention, the operation of parasitic transistors can be inhibited without increasing the element area, and resistance to latch-up can be improved. Also, the element separation of a low resistance that does not depend on the thickness and impurity content of the epitaxial layer, and the conditions of heat treatment can be formed.

Further, the present invention is not limited to these embodiments, but variations and modifications may be made without departing from the scope of the present invention.

The entire disclosure of Japanese Patent Application No. 2001-197190 filed on Jun. 28, 2001 containing specification, claims, drawings and summary are incorporated herein by reference in its entirety.

What is claimed is

1. A method for manufacturing a semiconductor device, comprising the steps of:
   forming a buried diffusion layer of a second conductivity type in the surface layer of a prescribed area of a substrate of a first conductivity type;
   forming a first high-concentration isolation diffusion layer of the first conductivity type in the substrate so as to surround the buried diffusion layer;
   forming an epitaxial layer of the second conductivity type on the substrate, the buried diffusion layer, and the first high-concentration isolation diffusion layer;
   forming a low-concentration isolation diffusion layer of the first conductivity type in the epitaxial layer on the first high-concentration isolation diffusion layer, the low-concentration isolation diffusion layer isolating the epitaxial layer into a plurality of island regions;
   forming a second high-concentration isolation diffusion layer of the first conductivity type in the junction area between the first high-concentration isolation diffusion layer and the low-concentration isolation diffusion layer;
   forming a high-concentration diffusion layer of the first conductivity type in direct physical contact with an upper layer of said buried diffusion layer; forming, after formation of the epitaxial layer, a first diffusion layer of the first conductivity type in a third island region of the epitaxial layer on the buried diffusion layer;
   forming a second diffusion layer of the second conductivity type in the third island region adjacent to the first diffusion layer; and
   forming a high-concentration diffusion layer of the first conductivity type in the junction area between the buried diffusion layer and the first diffusion layer;
   wherein said step of forming the first diffusion layer is simultaneously performed with said step of forming the low-concentration isolation diffusion layer, and
   said step of forming the high-concentration diffusion layer is simultaneously performed with said step of forming the second high-concentration isolation diffusion layer.

2. The method for manufacturing a semiconductor device according to claim 1,
   wherein said step of forming the low-concentration isolation diffusion layer and the first diffusion layer is simultaneously performed with said step of forming the second high-concentration isolation diffusion layer and the high-concentration diffusion layer.

3. The method for manufacturing a semiconductor device according to claim 2,
   wherein the low-concentration isolation diffusion layer, the first diffusion layer, the second high-concentration isolation diffusion layer, and the high-concentration diffusion layer are formed by implanting impurities several times using the same mask and by thermally diffusing the impurities, and
   the depths of the impurities implanted several times are different.

4. The method for manufacturing a semiconductor device according to claim 1,
   wherein the low-concentration isolation diffusion layer and the first diffusion layer are formed by implanting impurities several times using the same mask and by thermally diffusing the impurities, and
   the depths of the impurities implanted several times are different.

5. A method for manufacturing a semiconductor device, comprising the steps of:
   forming a buried diffusion layer of a second conductivity type in the surface layer of a prescribed area of a substrate of a first conductivity type;
   forming a first high-concentration isolation diffusion layer of the first conductivity type in the substrate so as to surround the buried diffusion layer;
   forming an epitaxial layer of the second conductivity type on the substrate, the buried diffusion layer, and the first high-concentration isolation diffusion layer;
   forming a low-concentration isolation diffusion layer of the first conductivity type in the epitaxial layer on the first high-concentration isolation diffusion layer, the low-concentration isolation diffusion layer isolating the epitaxial layer into a plurality of island regions;
   forming a second high-concentration isolation diffusion layer of the first conductivity type in the junction area between the first high-concentration isolation diffusion layer and the low-concentration isolation diffusion layer;
   forming a high-concentration diffusion layer of the first conductivity type in direct physical contact with an upper layer of said buried diffusion layer;
   forming, after formation of the epitaxial layer, a first diffusion layer of the first conductivity type in a third island region of the epitaxial layer on the buried diffusion layer;

forming a second diffusion layer of the second conductivity type in the third island region adjacent to the first diffusion layer;

forming a high-concentration diffusion layer of the first conductivity type in the junction area between the buried diffusion layer and the first diffusion layer;

forming, after formation of the high-concentration diffusion layer, a third circuit element having a diffusion region of the second conductivity type in the first diffusion layer; and forming a fourth circuit element having a diffusion region of the first conductivity type in the second diffusion layer, wherein said step of forming the first diffusion layer is simultaneously performed with said step of forming the low-concentration isolation diffusion layer, and said step of forming the high-concentration diffusion layer is simultaneously performed with said step of forming the second high-concentration isolation diffusion layer.

* * * * *